US011585853B2

(12) United States Patent
Mrugalski et al.

(10) Patent No.: US 11,585,853 B2
(45) Date of Patent: Feb. 21, 2023

(54) TRAJECTORY-OPTIMIZED TEST PATTERN GENERATION FOR BUILT-IN SELF-TEST

(71) Applicant: Siemens Industry Software Inc., Plano, TX (US)

(72) Inventors: Grzegorz Mrugalski, Swarzedz (PL); Nilanjan Mukherjee, Wilsonville, OR (US); Janusz Rajski, West Linn, OR (US); Lukasz Rybak, Poznań (PL); Jerzy Tyszer, Poznan (PL)

(73) Assignee: Siemens Industry Software Inc., Plano, TX (US)

( * ) Notice: Subject to any disclaimer, the term of this patent is extended or adjusted under 35 U.S.C. 154(b) by 155 days.

(21) Appl. No.: 16/950,176

(22) Filed: Nov. 17, 2020

(65) Prior Publication Data

US 2021/0156918 A1 May 27, 2021

Related U.S. Application Data

(60) Provisional application No. 62/938,406, filed on Nov. 21, 2019.

(51) Int. Cl.
*G01R 31/3183* (2006.01)
*G01R 31/3187* (2006.01)
(Continued)

(52) U.S. Cl.
CPC . *G01R 31/318385* (2013.01); *G01R 31/3187* (2013.01); *G01R 31/31813* (2013.01);
(Continued)

(58) Field of Classification Search
CPC .... G01R 31/318547; G01R 31/318541; G01R 31/318385; G01R 31/31813;
(Continued)

(56) References Cited

U.S. PATENT DOCUMENTS

| 2002/0073373 | A1* | 6/2002 | Nakao | G11C 29/10 |
| | | | | 714/728 |
| 2016/0245863 | A1* | 8/2016 | Mrugalski | G01R 31/318547 |
| 2016/0378444 | A1* | 12/2016 | Shih | G06F 8/4432 |
| | | | | 717/151 |

OTHER PUBLICATIONS

H.-J. Wunderlich and G. Kiefer, "Bit-Flipping BIST," in Proc. ICCAD, 1996, pp. 337-343.
N.A. Touba and E.J. McCluskey, "Bit-Fixing in Pseudorandom Sequences for Scan BIST," IEEE Trans. CAD, vol. 20, No. 4, Apr. 2001, pp. 545-555, 2001.
K.-H. Tsai et al., "Star Test: The Theory and Its Applications," IEEE Trans. CAD, vol. 19, No. 9, Sep. 2000, pp. 1052-1064.
(Continued)

*Primary Examiner* — Cynthia Britt
*Assistant Examiner* — Sazzad Hossain

(57) ABSTRACT

A circuit comprises: a bit-flipping signal generation device comprising a storage device and configured to generate a bit-flipping signal based on bit-flipping location information, the storage device configured to store the bit-flipping location information for a first number of bits, the bit-flipping location information obtained through a fault simulation process; a pseudo random test pattern generator configured to generate test patterns based on the bit-flipping signal, the pseudo random test pattern generator comprising a register configured to be a linear finite state machine, the register comprising storage elements and bit-flipping devices, each of the bit-flipping devices coupled to one of the storage elements; and scan chains configured to receive the test patterns, wherein the bit-flipping signal causes one of the bit-flipping devices to invert a bit of the register each time a second number of test patterns is being generated by the pseudo random test pattern generator during a test.

16 Claims, 11 Drawing Sheets

(51) Int. Cl.
 *G01R 31/3185* (2006.01)
 *G01R 31/3181* (2006.01)
 *G01R 31/319* (2006.01)

(52) U.S. Cl.
 CPC .. *G01R 31/318536* (2013.01); *G01R 31/3183* (2013.01); *G01R 31/31908* (2013.01); *G01R 31/31919* (2013.01); *G01R 31/318335* (2013.01); *G01R 31/318342* (2013.01); *G01R 31/318357* (2013.01); *G01R 31/318541* (2013.01); *G01R 31/318547* (2013.01); *G01R 31/318583* (2013.01)

(58) Field of Classification Search
 CPC ........ G01R 31/318335; G01R 31/3183; G01R 31/318536; G01R 31/31919; G01R 31/318342; G01R 31/318357; G01R 31/318583; G01R 31/31908
 See application file for complete search history.

(56) References Cited

OTHER PUBLICATIONS

G. Mrugalski et al. "Star-EDT: Deterministic on-Chip Scheme Using Compressed Test Patterns," IEEE Trans. CAD, vol. 36, No. 4, Apr. 2017, pp. 683-693.

Y. Liu et al., "Deterministic Stellar BIST for in-System Automotive Test," in Proc. ITC, Paper 13.2, 2018, pp. 1-9.

L. Li and K. Chakrabarty disclose, in "Test Set Embedding for Deterministic BIST Using a Reconfigurable Interconnection Network," IEEE Trans CAD, vol. 23, No. 9, Sep. 2004, pp. 1289-1305.

V. Tenentes et al., "Single and Variable-State-Skip LFSRs: Bridging the Gap Between Test Data Compression and Test Set Embedding for IP Cores," IEEE Trans. CAD, vol. 29, No. 10, Oct. 2010, pp. 1640-1644.

* cited by examiner

|    | Gates | Scan cells | Scan chains | Longest chain | Test points | Stuck-at faults |
|----|-------|------------|-------------|---------------|-------------|-----------------|
| D1 | 1.18M | 45K        | 196         | 232           | 951         | 1,032,901       |
| D2 | 460K  | 46K        | 226         | 204           | 680         | 721,556         |
| D3 | 2.3M  | 202K       | 498         | 407           | 3,966       | 2,527,880       |
| D4 | 848K  | 53K        | 461         | 116           | 1,028       | 749,771         |
| D5 | 1.56M | 94K        | 489         | 194           | 1,846       | 1,558,274       |
| D6 | 1.77M | 158K       | 500         | 317           | 200         | 2,191,472       |
| D7 | 1.73M | 90K        | 203         | 445           | 2,613       | 1,708,589       |

FIG. 9

TRAJECTORY-OPTIMIZED TEST PATTERN GENERATION FOR BUILT-IN SELF-TEST

RELATED APPLICATIONS

This application claims the benefit of U.S. Provisional Patent Application No. 62/938,406, filed on Nov. 21, 2019, which application is incorporated entirely herein by reference.

FIELD OF THE DISCLOSED TECHNIQUES

The presently disclosed techniques relates to circuit testing. Various implementations of the disclosed techniques may be particularly useful for test pattern generation for in-system test.

BACKGROUND OF THE DISCLOSED TECHNIQUES

Many electronic components used in driverless cars perform safety critical functions.

One of the most important requirements to ensure functional safety is the "absence of unreasonable risk due to hazards caused by malfunctioning behavior of electrical/electronic systems" defined by ISO 26262 standard. Some integrated circuits used in these applications may have more than 10 billion transistors and require 500 distinct manufacturing steps. The first challenge is to make sure that every million chips shipped from the fab have less than one defective component. The second challenge is that the safety critical circuits can detect defects during system operations and when it occurs, put the whole system in a safe state to avoid a system failure. The highest standard for Automotive Safety Integrity Level (ASIL) D requires that the system failure occurs less than 100 times for one billion hours of operation.

Significant efforts have been devoted to test electronics for ensuring safe automotive performance. Logic built-in self-test (LBIST) is becoming more prevalent in safety-critical or high-reliability systems such as engine management, transmission control, anti-lock braking, steering control, and collision avoidance. The in-field and in-system tests performed in these systems need to meet a number of requirements. First, periodic tests during functional operations should be able to run within short time periods available, e.g., anything between 5 and 50 milliseconds. Key-on tests also have a very little time budget, and thus only limited functions can be tested. On the other hand, the time for budget key-off tests is 10 times that of the key-on tests and thus more comprehensive testing can be accomplished. Therefore, LBIST-based tests need to accommodate both situations. Furthermore, LBIST operating in a car environment has strict power constraints which limit test parallelism or scan shift speed. Finally, in accordance with the ASIL D requirement, LBIST has to reach stuck-at fault coverage of more than 90%.

A conventional LBIST often cannot achieve high fault coverage due to random-resistant faults and linear as well as structural dependencies in LFSR-produced tests precluding generation of certain desired test sequences. To solve this problem, weighted or perturbed pseudorandom patterns have been explored. A bit-flipping technique, disclosed in H.-J. Wunderlich and G. Kiefer, "Bit-flipping BIST," in *Proc. ICCAD*, 1996, pp. 337-343, depends on a test set which has to be substantially resynthesized every time desired test patterns change due to logic Engineering Change Order (ECO). A bit-fixing technique, disclosed in N. A. Touba and E. J. McCluskey, "Bit-fixing in pseudo random sequences for scan BIST," *IEEE Trans. CAD*, vol. 20, pp. 545-555, 2001, shares some characteristics with the bit-flipping one in that both alter the LFSR-generated sequence. Instead of perturbing pseudorandom tests, however, one can use clusters of patterns comprising a deterministic parent vector and its random or deterministic derivatives. For example, a Star-BIST technique, disclosed in K.-H. Tsai et al., "Star test: the theory and its applications," *IEEE Trans. CAD*, vol. 19, no. 9, pp. 1052-1064, September 2000, selectively flips parent ATPG patterns, while scan behaves like a ROM capable of encoding deterministic test vectors. A Star-EDT technique, disclosed in G. Mrugalski et al. "Star-EDT: Deterministic on-chip scheme using compressed test patterns," IEEE Trans. CAD, vol. 36, no. 4, pp. 683-693, 2017, deterministically designates scan-slices of EDT-decompressed test patterns to be flipped during scan shift-in operations. While inheriting some principles of the Star-EDT technique, a Stellar BIST, disclosed in Y. Liu et al., "Deterministic Stellar BIST for in-system automotive test," in *Proc. ITC*, paper 13.2, 2018, complements parent's bit slices several times during a single test application. The same approach may skew multiple complements to enrich population of patterns.

The effectiveness of pseudorandom test patterns can be significantly improved by means of test points activating and observing faults. Test points need extra gates and flip-flops, however. The number of test points thus is usually not large, which can limit the resultant test coverage. Although LBIST test points may also reduce test pattern counts, only conflict-aware or hybrid test points may decrease the number of test vectors in a consistent manner.

L. Lei and K. Chakrabarty disclose, in "Test set embedding for deterministic BIST using a reconfigurable interconnection network," IEEE Trans. CAD, vol. 23, pp. 1289-1305, 2004, a technique for embedding test patterns into LFSR-reseeding-based sequences. A technique, disclosed in V. Tenentes et al., "Single and variable-state-skip LFSRs: bridging the gap between test data compression and test set embedding for IP cores," IEEE Trans. CAD, vol. 29, pp. 1640-1644, 2010 (referred to as Tenentes hereinafter), uses an LFSR with the capability of performing successive jumps of a constant length (or a few different spans) in the LFSR state sequence. The latter technique can reduce a sequence of a test set embedding method by quickly traversing its irrelevant parts at the expense of additional state-skip logic.

BRIEF SUMMARY OF THE DISCLOSED TECHNIQUES

Various aspects of the disclosed technology relate to seed-flipping-based pseudo random pattern generation. In one aspect, there is a circuit, comprising: a bit-flipping signal generation device comprising a storage device and configured to generate a bit-flipping signal based on bit-flipping location information, the storage device configured to store the bit-flipping location information for a first number of bits, the bit-flipping location information obtained through a fault simulation process; a pseudo random test pattern generator configured to generate test patterns based on the bit-flipping signal, the pseudo random test pattern generator comprising a register configured to be a linear finite state machine, the register comprising storage elements and bit-flipping devices, each of the bit-flipping devices coupled to one of the storage elements; and scan chains configured to receive the test patterns; wherein the bit-flipping signal causes one of the bit-flipping devices to invert a bit of the register each time a second number of test patterns is being generated by the pseudo random test pattern generator during a test.

The register may be a ring generator and the pseudo random test pattern generator may further comprise a phase shifter configured to drive the scan chains based on signals outputted by the register.

The bit-flipping signal generation device may further comprise a demultiplexer and a group counter, select inputs of the demultiplexer being coupled to outputs of the storage device, a number of outputs of the demultiplexer being equal to the first number, and the group counter being configured to select the bit-flipping location information for a particular bit stored in the storage device for the outputs of the storage device.

Capacity of the storage device may be $g\lg_2 k$ bits, k being the first number, g being a number of groups of the second number of test patterns generated by the pseudo random test pattern generator for a test.

The bit-flipping devices may be XOR gates and the storage elements may be flip-flops.

The bit-flipping location information for the first number of bits may comprise none of the first number of bits to be inverted in a test, one or more bits in the first number of bits to be inverted two times or more consecutively or non-consecutively in a sequence for a test, or both.

The fault simulation process may comprise: performing fault simulation for the first number of groups of test patterns, each group in the groups of the second number of test patterns having the second number of test patterns and being generated by the pseudo random test pattern generator starting from a state obtained by inverting one particular bit in the first number of bits; selecting a group of test patterns from the first number of groups of test patterns which can detect a largest number of faults in a target group of faults based on the fault simulation; saving location information for the flipped bit associated with the group of test patterns and a state of the register associated with a last pattern in the group of test patterns; and updating the target group of faults by removing faults detectable by the group of test patterns. The fault simulation process may further comprise: repeating the above operations until the target group of faults have no faults left or until a number of the groups of test patterns selected is equal to a third number.

In another aspect, there are one or more non-transitory computer-readable media storing computer-executable instructions for causing one or more processors to perform a method, the method comprising: creating the above circuit in a circuit design for testing a chip fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 9 lists some characteristics of seven industrial circuits D1-D7: the number of gates, the number of scan cells, the scan architecture, the number of test points and the number of stuck-at faults to be targeted.

DETAILED DESCRIPTION OF THE DISCLOSED TECHNIQUES

General Considerations

Various aspects of the disclosed technology relate to seed-flipping-based pseudo random pattern generation. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate," "flip," and "invert" to describe the disclosed method or the device function/structure.

Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
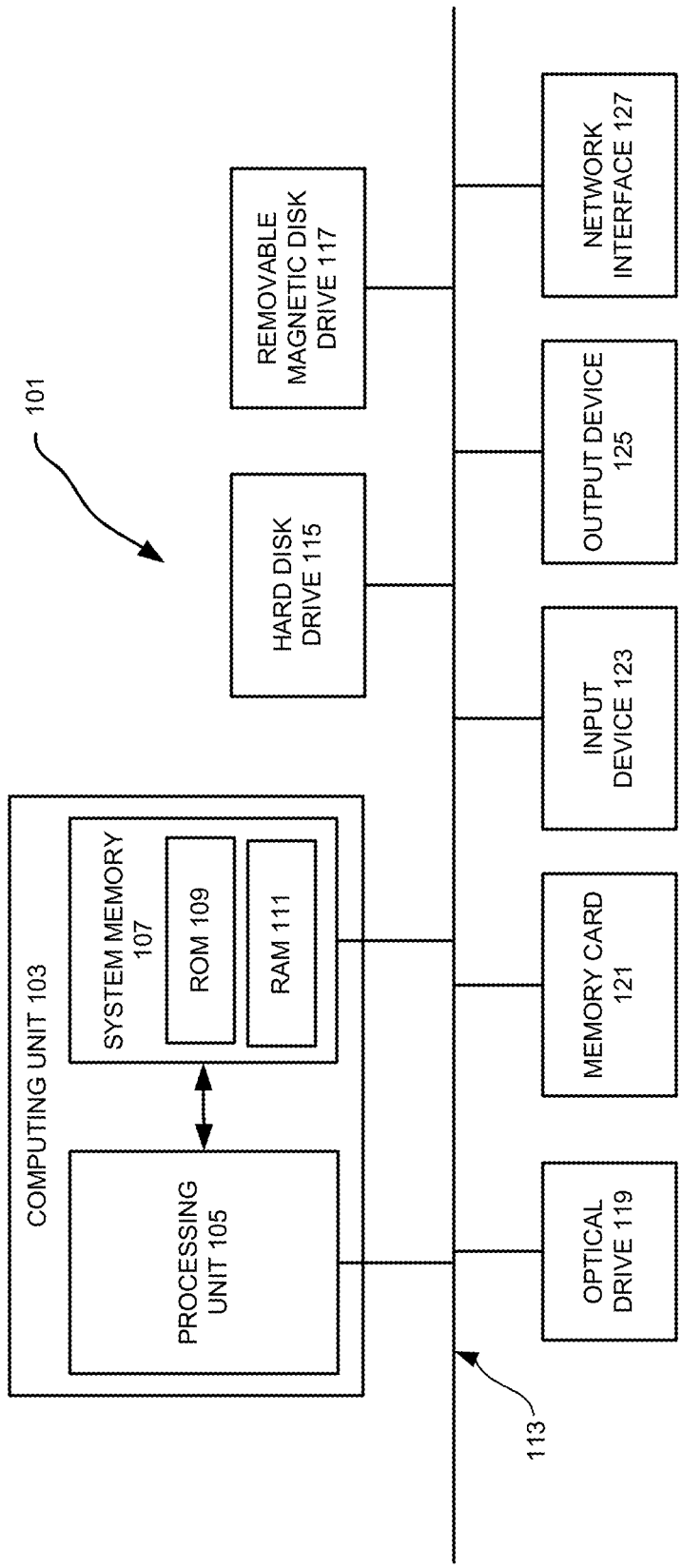
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random-access memory (RAM) 111. As will be appreciated by those of ordinary skill in the art, both the read-only memory (ROM) 109 and the random-access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design For Test, Test Pattern Generation, And Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell includes an edge-triggered flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above-mentioned processes, design insertion for testing, test pattern generation, and logic diagnosis, are normally performed by various electronic design automation tools such as those in the Tessent family of software tools available from Mentor Graphics Corporation, Wilsonville, Oreg.

Seed Distribution For PRPG Static Reseeding

Given a feasible test time, some parts of the PRPG state trajectory cannot be visited. As such, many necessary test patterns for detecting certain faults could not be generated. These faults are sometimes referred to as random resistant faults. The presence of random resistant faults and linear as well as structural dependencies in LFSR-produced tests prevent a conventional PRPG from achieving a target test coverage within a reasonable test application time.

A seed is a PRPG initial state. When the PRPG is loaded with this initial state, it loads the scan chains with the desired pattern after m clock cycles, where m is the length of the scan chains. The state of the PRPG after loading the scan chains is sometimes referred to as the final state. Reseeding refers to loading the PRPG with a seed that expands into a precomputed test pattern. In the static reseeding mode, PRPG applies pseudorandom patterns between the deterministic seeds to detect more faults than using pure pseudorandom patterns within a limited time period.

Figure 2:
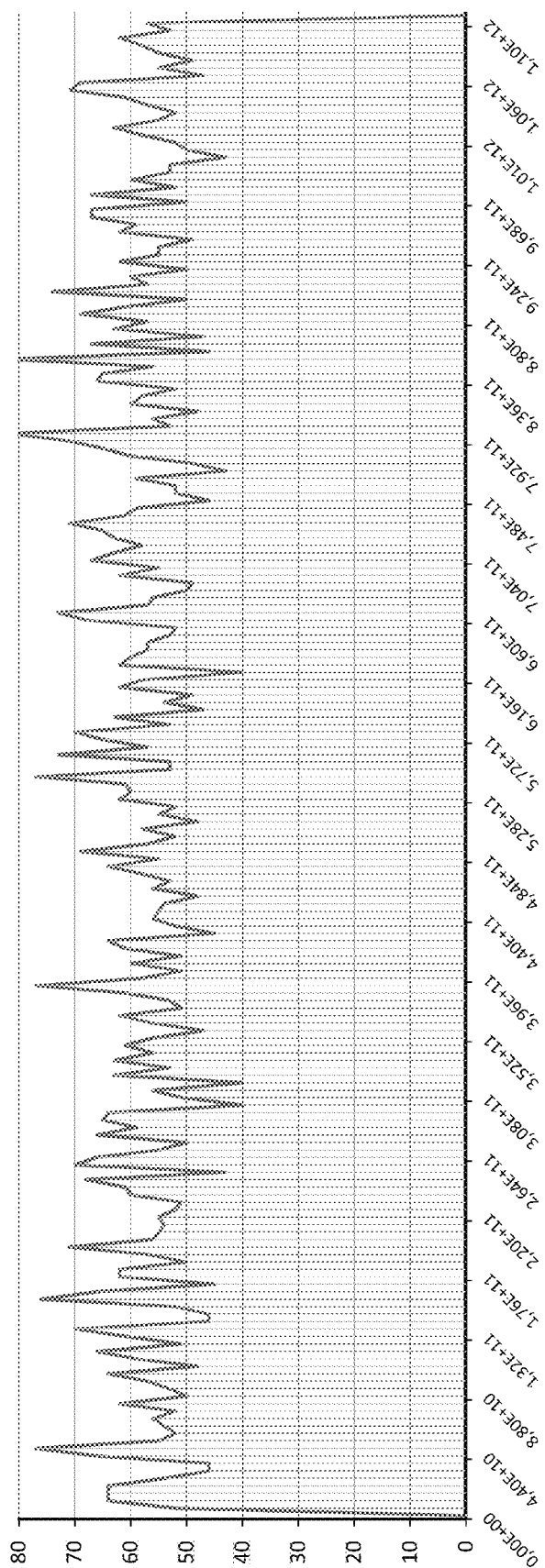
FIG. 2 illustrates a distribution of seeds needed for detecting a group of target faults for an industrial design via static PRPG reseeding.

FIG. 2 illustrates a distribution of seeds needed for detecting a group of target faults for an industrial design. The industrial design comprises 1.2M gates and 60K scan cells which form 200 scan chains. A 40-bit PRPG works in the static reseeding mode to generate test patterns for the scan chains. The x-axis of the histogram corresponds to the entire state trajectory of the 40-bit PRPG. The state trajectory comprises $2^{40}-1 \approx 1.1 \times 10^{12}$ states and is divided into 200 evenly spaced non-overlapping intervals (bins) [$b_k$, $b_{k+1}$) (k=0-199). Each bin has $5.5 \times 10^9$ consecutive PRPG states. The y-axis of the histogram represents the number of 40-bit vectors in each bin which are needed to seed the PRPG for covering some of the target 487,900 random resistant stuck-at faults.

As the figure shows, the distribution of required seeds is fairly uniform, i.e., in order to detect all of the target faults, one would need to traverse virtually the entire PRPG state space. This is unrealistic in practice. Similar results have been obtained for many other industrial circuits. Therefore, a reseeding approach that not only balances test application time and coverage but also requires less silicon area overhead for storing seeds is desirable for in-system testing.

Seed Flipping For PRPG Static Reseeding

Visiting disjoint parts of the PRPG state space (also referred to as PRPG state trajectory) frequently can improve the PRPG effectiveness. The technique disclosed in Tenentes attempts to use a state-skip PRPG to realize this functionality. Its constant-length jumps, however, cannot flexibly traverse the PRPG trajectory. Moreover, selecting the most appropriate states to skip in large designs is a compute-intensive trial-and-error process, whereas the PRPG design is not generic and remains a test-dependent structure.

Figure 3:
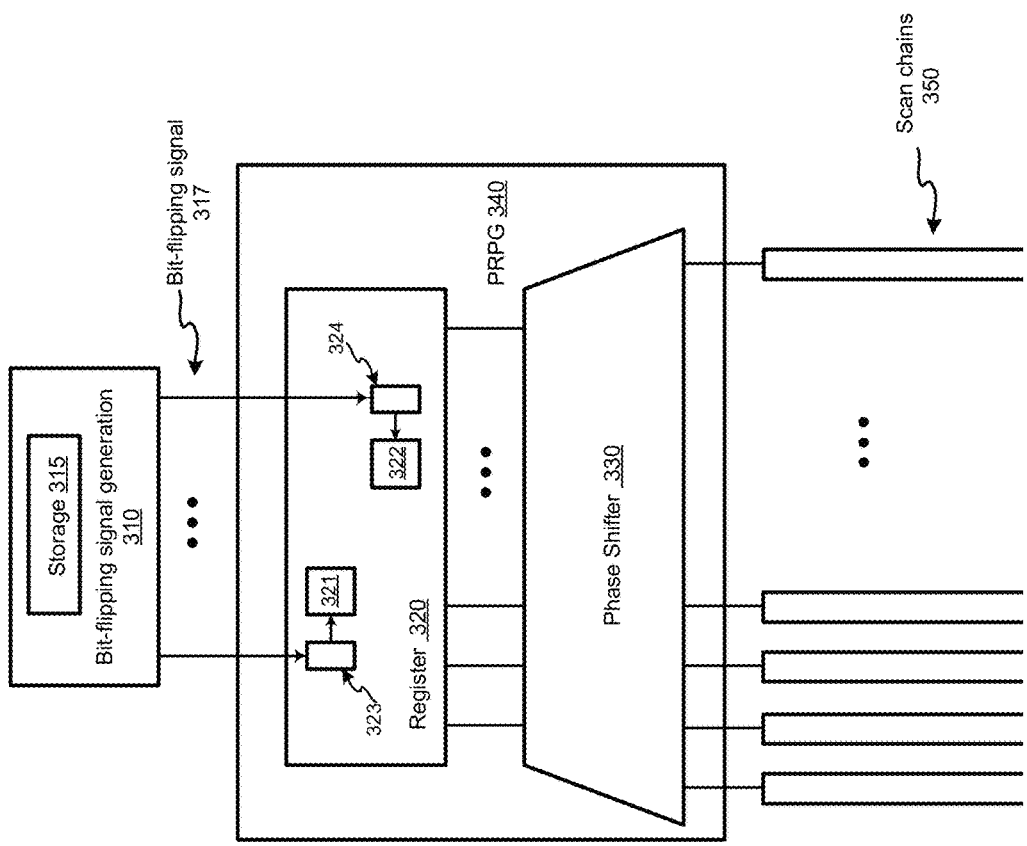
FIG. 3 illustrates an example of a PRPG-based test circuit configured to periodically complement one of the PRPG stages according to various embodiments of the disclosed technology.

FIG. 3 illustrates an example of a PRPG-based test circuit configured to periodically complement one of the PRPG stages according to various embodiments of the disclosed technology. The test circuit comprises a bit-flipping signal generation device 310, a pseudo random pattern generator (PRPG) 340, and scan chains 350. The bit-flipping signal generation device 310 is configured to generate a bit-flipping signal 317 based on bit-flipping location information. It comprises a storage device 315 which is configured to store the bit-flipping location information for a particular number of bits of the pseudo random pattern generator 340. The storage device 315 may be a microcircuit memory device such as read-write memory (RANI), read-only memory (ROM), electronically erasable and programmable read-only memory (EEPROM) or flash memory microcircuit device. The bit-flipping location information is obtained through a fault simulation process.

The pseudo random pattern generator 340 is configured to generate test patterns based on the bit-flipping signal 317. The generated test patterns are shifted into the scan chains 350. The pseudo random pattern generator 340 comprises a register 320 configured to be a linear finite state machine. One example of the register 320 is a conventional linear feedback shift register. Another example of the register 320 is a ring generator. The register 320 comprises storage elements and bit-flipping devices. Each of the bit-flipping devices is coupled to one of the storage elements. FIG. 3 shows the storage elements 321 and 322 are coupled to the bit-flipping devices 323 and 324, respectively. The pseudo random pattern generator 340 may further comprise a phase shifter 330. The phase shifter 330 may comprise XOR gates. The phase shifter 330 can expand the limited outputs of the register 320 to drive the large number of the scan chains 350. A careful design of the phase shifter 330 can also reduce structural dependencies between sequences leaving the register 320.

During a test, the bit-flipping signal 317 causes one of the bit-flipping devices (e.g., 323 or 324) to invert a bit of the register (e.g., 321 or 322) each time a specific number of test patterns is being generated by the pseudo random test pattern generator 340. This is equivalent to injecting a new seed into the pseudo random test pattern generator 340 each time the specific number of test patterns are being generated. The bit-flipping operation enables the pseudo random test pattern generator 340 to visit disjoint parts of the PRPG state trajectory periodically.

Figure 4:
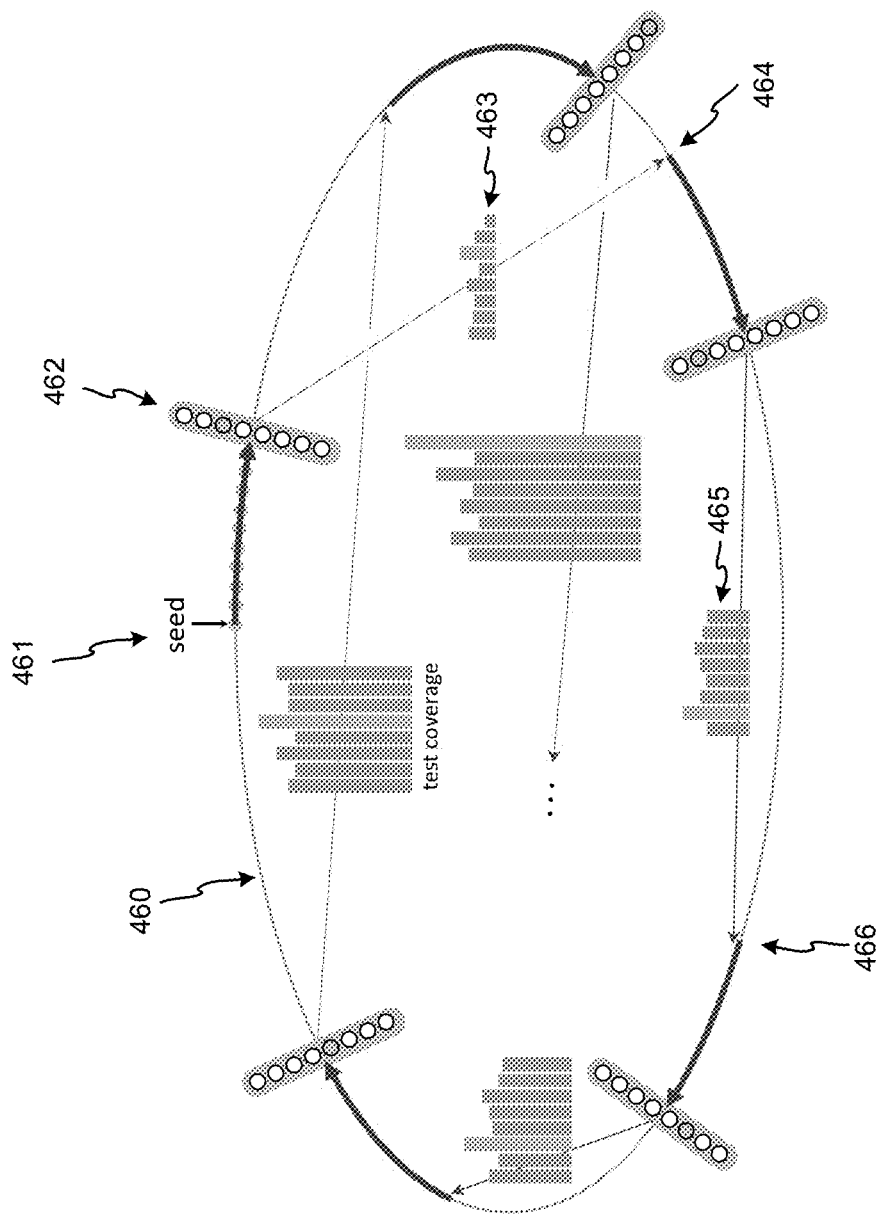
FIG. 4 illustrates an example of a PRPG state trajectory and a series of PRPG stages for a pseudo random test pattern generator operating in a seed flipping scheme according to various embodiments of the disclosed technology.

FIG. 4 illustrates an example of a PRPG state trajectory 460 and a series of PRPG stages for a pseudo random test pattern generator operating in a seed flipping scheme according to various embodiments of the disclosed technology. The seed-flipping pseudo random test pattern generator starts at seed 461 and generates c test patterns during the first PRPG stage. After the last of the c test patterns is loaded into scan chains, one of the k bits of the register in the seed-flipping pseudo random test pattern generator is inverted. In this example, k=8. A diagram 463 shows simulated fault coverage for inverting each of the eight bits. According to the diagram 463, the third bit, if inverted, can lead to the highest number of faults being detected and is thus selected for bit-flipping. As a result, the seed-flipping pseudo random test pattern generator reaches seed 464 and the second PRPG stage begins. At the end of the second PRPG stage, the second bit is selected for inverting based on a fault coverage diagram 465. This causes the seed-flipping PRPG stage to reach seed 466 and the third PRPG stage begins. This process is repeated multiple times until the total number of PRPG stages reaches a preset number. It should be noted that the eight bits considered for flipping are not necessarily consecutive and that depending on the simulation process, one or more of the bits may be selected to be inverted more than once while some bits may not be selected at all.

Figure 5:
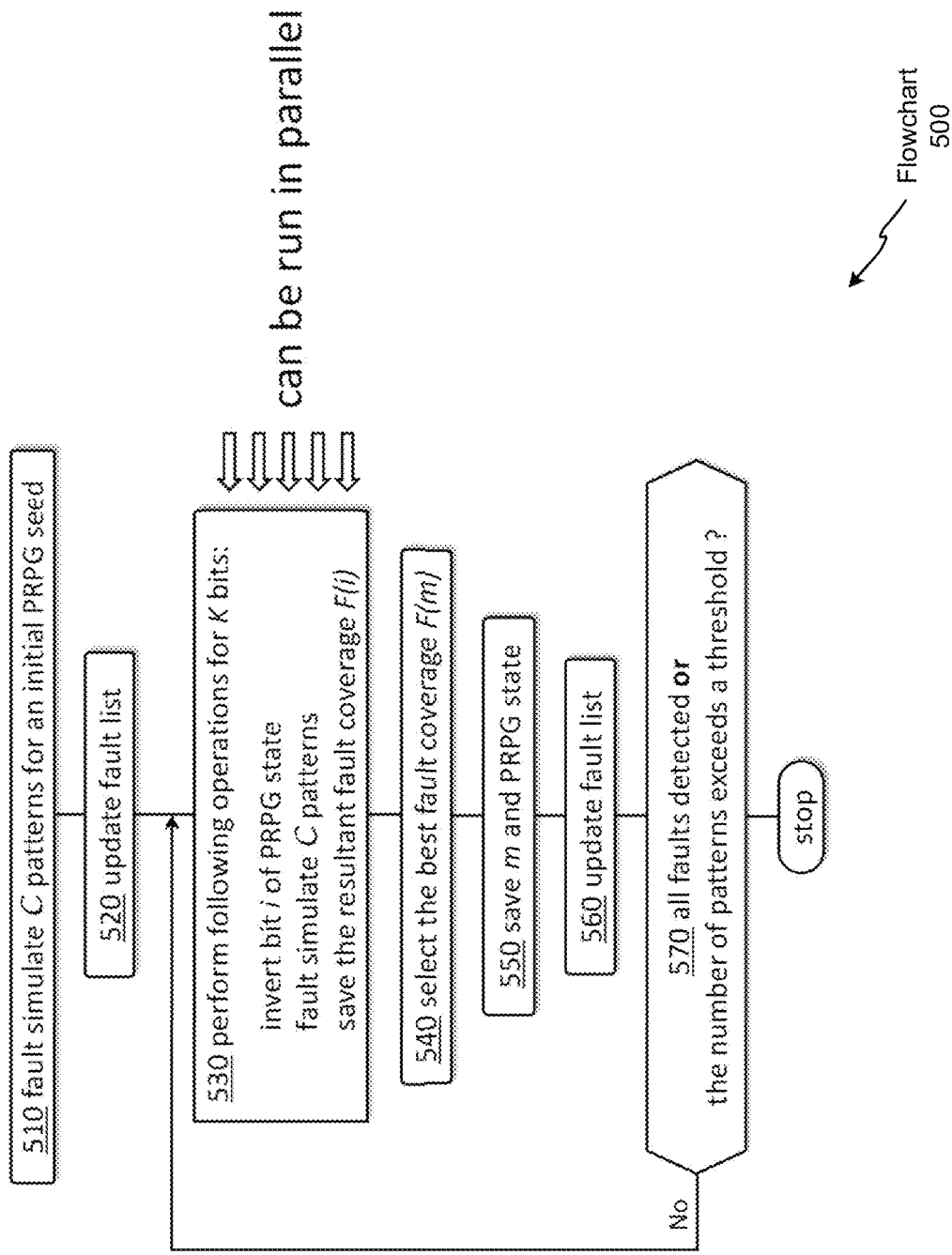
FIG. 5 illustrates a flowchart showing a simulation process for determining bit-flipping location information that may be implemented according to various examples of the disclosed technology.

FIG. 5 illustrates a flowchart 500 showing a simulation process for determining bit-flipping location information that may be implemented according to various examples of the disclosed technology. In operation 510, fault simulation is performed for c test patterns. The c test patterns are generated consecutively by a pseudo random pattern generator after the pseudo random pattern generator starts with an initial seed. The fault simulation may be performed by injecting each of the target faults into the circuit design and determining whether it can be activated and observed by applying each of the c test patterns.

In operation 520, the faults that can be detected by the test patterns associated with the initial seed are removed from the initial list of target faults to derive an updated list of target faults, and the state of the pseudo random pattern generator after the last test pattern in the test patterns is generated is saved as a pre-flipping state.

In operation 530, specific k bits of the pre-flipping state are flipped one bit at a time to derive k new seeds for the pseudo random pattern generator. Fault simulation similar to the operation 510 is performed for c test patterns arising from each of the k new seeds. Here, the updated list of target faults is used. Again, the fault simulation can be conducted for each of the c test patterns associated with each of the new seeds. The number of the faults in the updated list of target faults that can be detected by the test patterns associated with each of the new seeds are saved.

In operation 540, the best new seed obtained by inverting bit m is determined based on the number of the faults in the updated list of target faults that can be detected by the test patterns associated with each of the new seeds. Typically, the larger number of the faults the c test patterns can detect, the better fault coverage F(i) the seed associated with the c test patterns has. The selection is in a greedy fashion. Other approaches may be adopted.

In operation 550, the location information for the bit m is saved and the state of the pseudo random pattern generator after the last test pattern associated with the best new seed is generated is saved as a new pre-flipping state.

In operation 560, a new updated list of target faults is derived by removing the faults that can be detected by the c test patterns associated with the best new seed.

In operation 570, the new updated list of target faults is checked to determine whether all of the original target faults are detected and the total number of test patterns is checked to determine whether it is equal to or exceeds a preset number n. If the answer to either check is yes, then the whole process stops. Otherwise, the operations 530-570 repeats with the new updated list of target faults and the new pre-flipping state.

It is worth noting that although g×k×c test patterns need to be simulated, where g is the number of groups of test patterns with each group associated with a seed, fault simulation processes performed for k inversions are independent, and therefore can be readily run in parallel.

Figure 6:
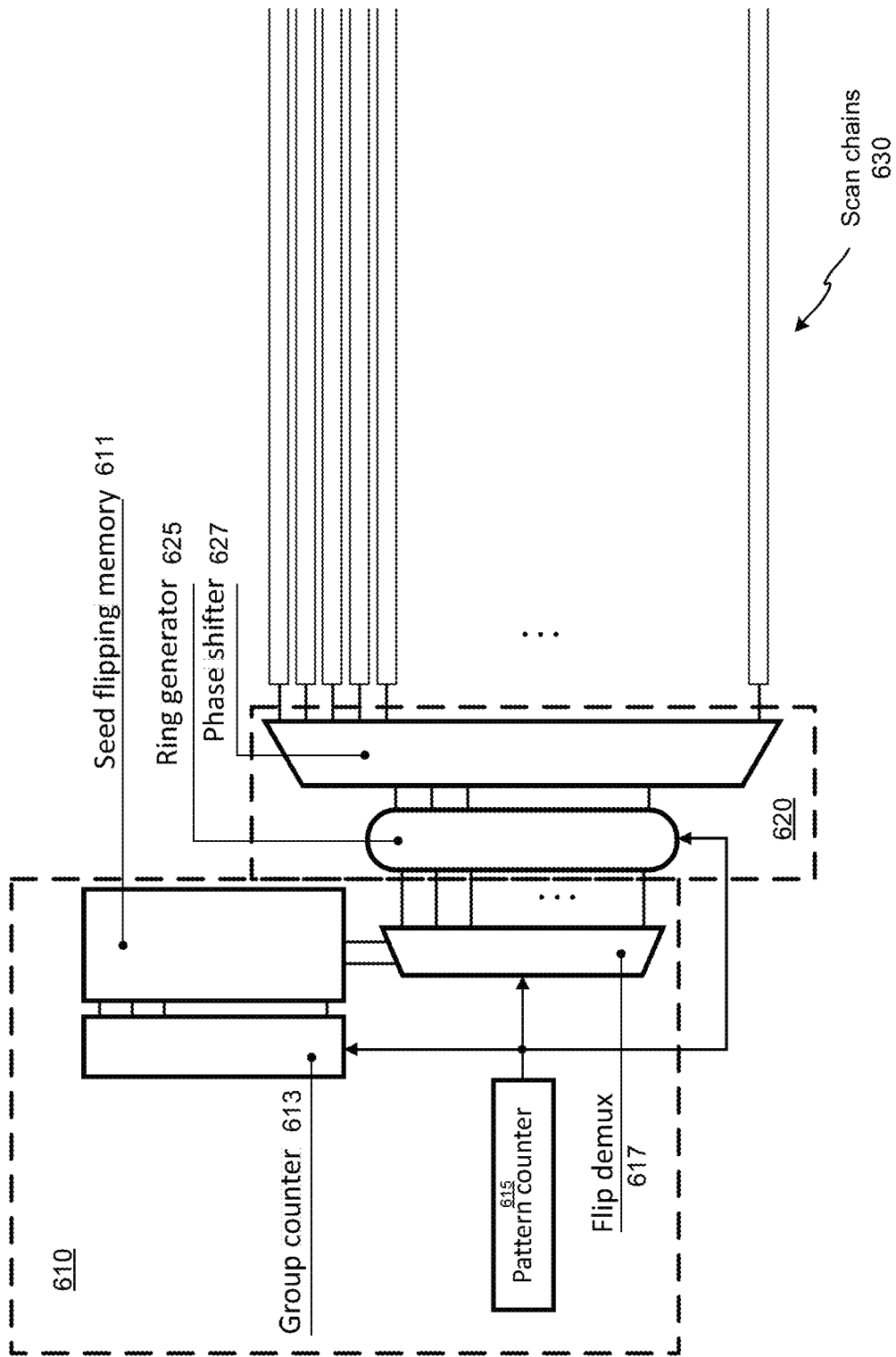
FIG. 6 illustrates an example of a seed-flipping PRPG-based test circuit according to some embodiments of the disclosed technology.

FIG. 6 illustrates an example of a seed-flipping PRPG-based test circuit according to some embodiments of the disclosed technology. The circuit comprises a bit-flipping signal generation device 610, a pseudo random pattern generator 620, and scan chains 630. The pseudo random pattern generator 620 comprises a ring generator 625 serving as the register and a phase shifter 627 driving the scan chains 630. The bit-flipping signal generation device 610 comprises a seed-flipping memory 611, a group counter 613, a pattern counter 615 and a flip demultiplexer 617.

Every c test patterns, the group counter 613 is configured to select location information for a bit stored in the seed-flipping memory 611 for output. The outputs of the seed flipping memory 611 are coupled to the Select inputs of the flip demultiplexer 617, asserting one of k outputs of a flip demultiplexer 617. The outputs of the flip demultiplexer 617 are coupled to k two-input XOR gates interleaved between the ring generator memory elements, respectively. The seed-flipping memory 611 has a capacity of $g lg_2 k$ bits, where g is the number of c-vector groups of test patterns that need to be applied.

Figure 7:
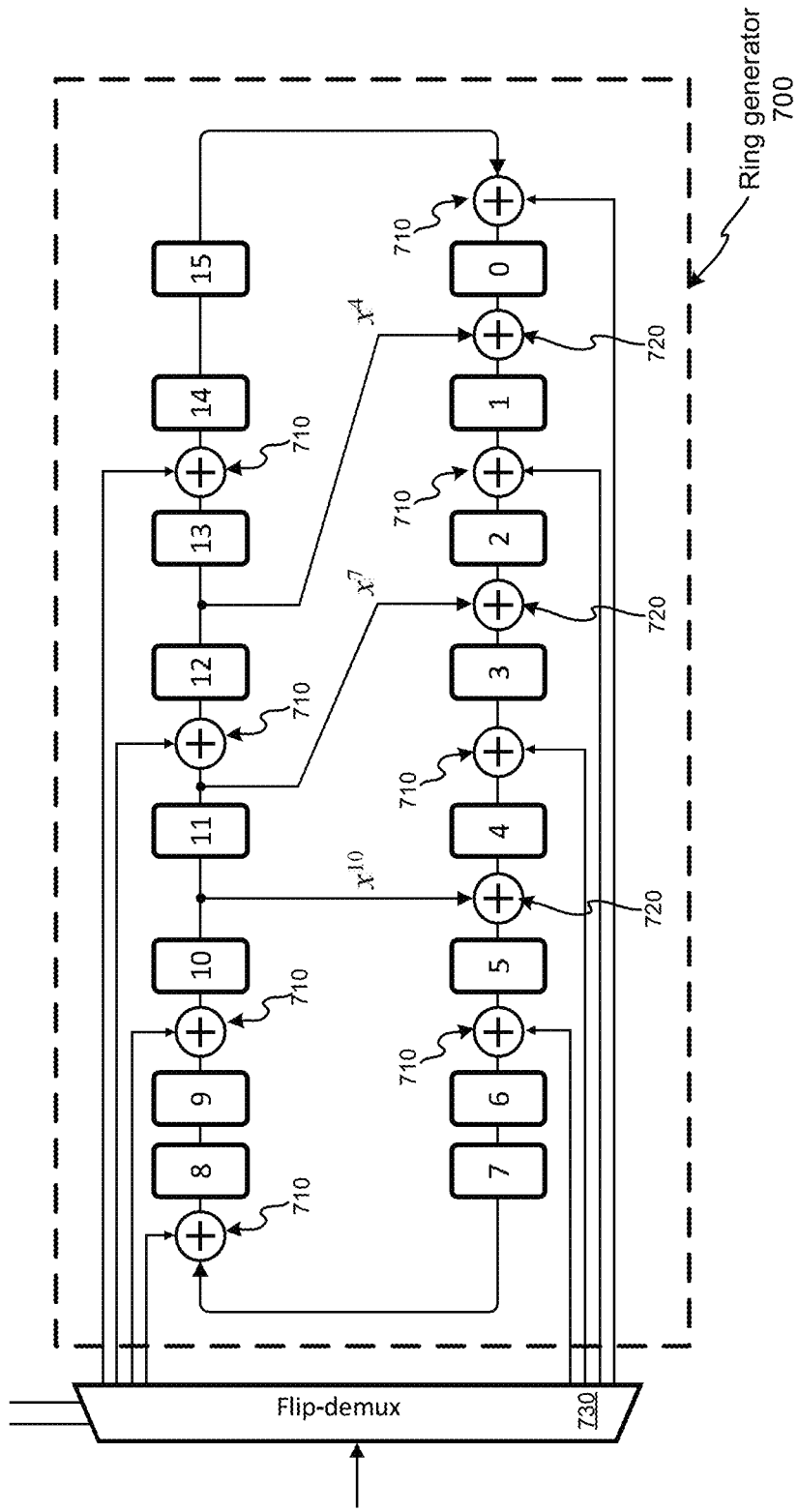
FIG. 7 illustrates an example of a block diagram of a 16-bit ring generator with the number of bits for flipping k=8.

FIG. 7 illustrates an example of a block diagram of a 16-bit ring generator 700 with the number of bits for flipping k=8. The 16-bit ring generator 700 comprises sixteen storage elements (flip-flops 0-15), three XOR gates 720 for feedback, and eight XOR gates 710 serving as bit-flipping devices. The 16-bit ring generator 700 implements a primitive polynomial $x^{16}+x^{10}+x^7+x^4+1$. The eight XOR gates 710 are placed such that every other flip-flop supplies its output to the adjacent neighbor through a controlled inversion. The eight XOR gates 710 are controlled by a flip demultiplexer 730. If one of the outputs of the demultiplexer 730 is asserted, the corresponding ring generator bit is subsequently inverted.

It is worth noting that a slightly different implementation than that of FIG. 7 can be employed as well. It assumes that, for example, the first output of the flip demultiplexer 730 is not used. Then fetching all-0 flip address indicates that no inversion is required at a certain step, and the generation process carries on with the current content of the ring generator.

It is also worth noting that adding additional XOR gates does not compromise PRPG performance, as a ring generator can be transformed by moving its feedback connections across memory elements so that its original transition function is preserved. As a result, a conflict of having two XOR gates in a row between two successive memory elements can be resolved by moving an XOR gate for feedback from the input of a given storage device to the input of its predecessor (or successor), and relocating the source tap of the feedback line accordingly.

Seed Sorting For PRPG Static Reseeding

Figure 8:
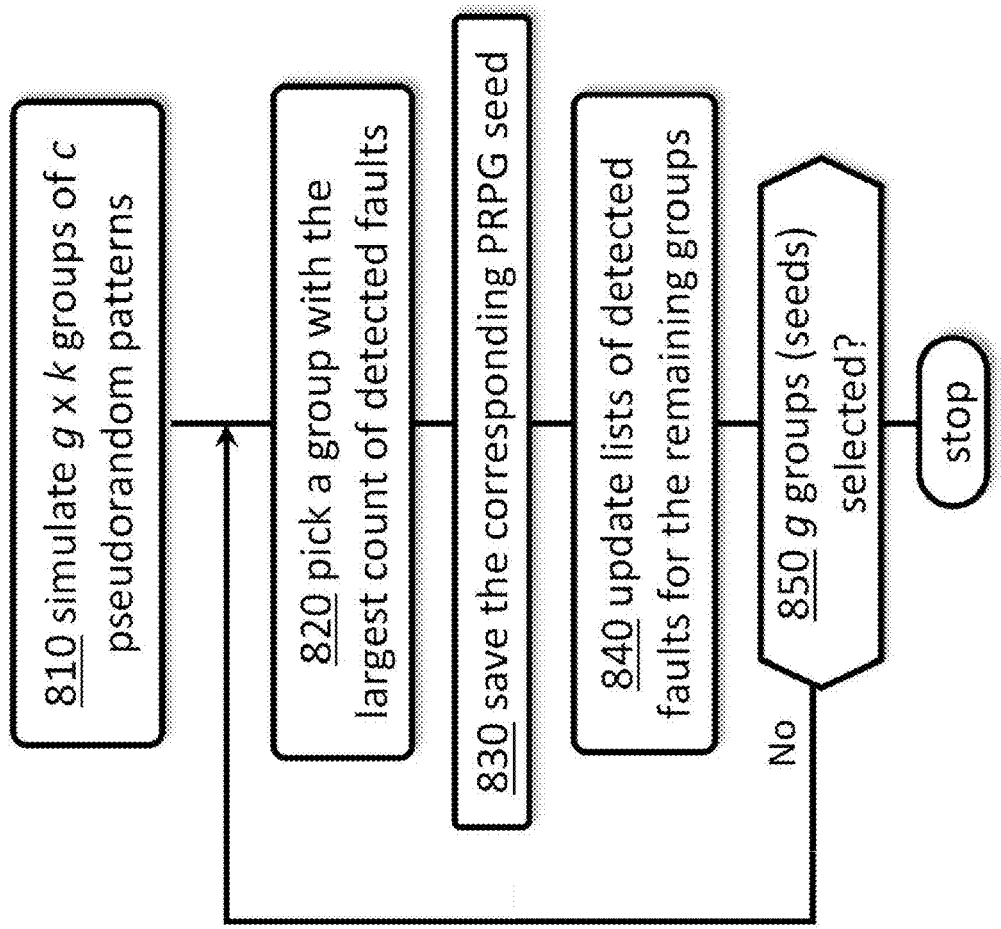
FIG. 8 illustrates a flowchart showing a fault simulation process for determining seed location information for seed sorting.

The seed sort technique can work with c-pattern groups like seed-flipping. These c-pattern groups, however, are selected differently. FIG. 8 illustrates a flowchart 800 showing a fault simulation process for determining seed location information for seed sorting. In operation 810, g×k groups of c pseudorandom patterns are fault-simulated to determine a list of fault detectable by each of the groups of c pseudo-random patterns. These g×k×c pseudorandom patterns belong to a single continuous (no breaks) segment of a PRPG trajectory. For the purpose of comparing seed sorting with seed flipping, the seed flipping parameters and the same list of target faults are used. In seed flipping, g groups of c test patterns are used for a test while k bits of the pseudo random pattern generator are evaluated for injecting new seeds via bit-flipping.

In operation 820, a group of c test patterns with the largest count of detected faults is selected and put in the front of the entire test sequence. In operation 830, the seed for the selected group of c test patterns is saved. In operation 840, an updated list of target faults is derived by removing the faults that can be detected by the group of c test patterns. In operation 850, the total number of groups of c test patterns is checked to determine whether it is equal to g. If the answer is no, the operations 820-850 are repeated with respect to the updated list of target faults; and if the answer is yes, the process is terminated.

The seed sorting technique works by repeatedly selecting the largest remaining fault count, and thus it operates as a type of selection sort. The way how the successive groups are ordered may result in a steep test coverage curve. Consequently, the seed sort may offer good trade-offs between test coverage and test application time.

To implement the seed sort technique, a seed memory that has a total capacity of g×n bits may be needed to drive a conventional pseudo random pattern generator, where n is the PRPG (or seed) size. This memory reloads the pseudo random pattern generator with a new seed every c patterns. Unlike the seed-flipping technique, the seed-sorting technique stores the entire seeds rather than binary encoded locations of PRPG stages to be inverted. Consequently, it may need up to $n/lg_2 k$ times more memory than the seed-flipping does, assuming the same number of simulated patterns and the same number of groups. For instance, the seed-flipping needs 8 times less memory than the seed-sorting when using a 32-bit pseudo random pattern generator with 16 memory elements subjected to inversion.

For the same number of simulated patterns, the seed-flipping can be deployed with a test memory that has the same capacity as that of the seed-sorting. As a result, one may encode more flipping steps, and the group size for the seed-flipping can be reduced by $n/lg_2 k$ times, which is referred to hereinafter as dense seed-flipping.

Examples Of Experimental Results

FIG. 9 lists some characteristics of seven industrial circuits D1-D7: the number of gates, the number of scan cells, the scan architecture, and the number of test points. It should also be noted that these designs may feature multiple clock domains. Consequently, test coverage results are collected for all domains by applying test patterns proportionally to a fault population of each domain. The target faults are stuck-at faults of which the total number is also listed in the figure. 20K pseudorandom test patterns are applied in each test case. They are produced by a 32-bit ring-generator-based PRPG feeding scan chains through a phase shifter and using a primitive polynomial $x^{32}+x^{25}+x^{15}+x^7+1$.

FIGS. 10A-10G illustrates the test coverage simulation results for successively applied test patterns (correspond primarily to the tail end of the experiments) for the circuits D1-D7, respectively. These results are obtained for the following four different test scenarios discussed earlier: 1) Baseline derived by a single continuous sequence of pseudorandom test patterns generated by a conventional pseudo random pattern generator in a routinely deployed standard BIST setup; 2) seed sorting derived by using groups of 256 pseudorandom test patterns each; 3) seed flipping derived by using a ring generator similar to that of FIG. 7, i.e., working with a 4-bit control data, and changing a PRPG seed every 256 test patterns; and 4) dense seed-flipping derived by employing a test memory of the same capacity as that of the corresponding seed sort; in other words, the seed flipping in this approach is 32/4=8 times as frequent as is in the seed sort or in the regular seed flipping—here every 256/8=32 patterns.

As can be seen from the figures, the test coverage of patterns generated by the seed sorting and the seed flipping is improved over the base-line results. The improvement in test coverage (which remains above the threshold of 90%) occurs across all of the seven designs. Furthermore, the seed sorting and the seed flipping can both improve the test coverage gradient, i.e., test-coverage-to-pattern-count ratio. While the seed sorting coverage curves are running slightly above those of the seed flipping, the seed flipping remains advantageous because of its much lower test data volume requirements and negligible differences between these two scenarios in most cases.

Figure 10B:
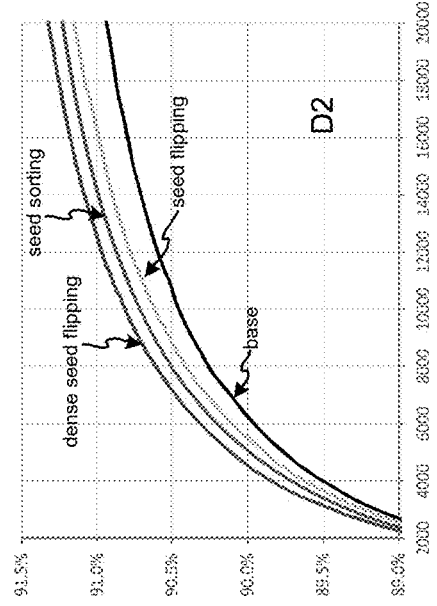
FIG. 10B illustrates the test coverage simulation result for successively applied test patterns for the circuit D2.
Figure 10D:
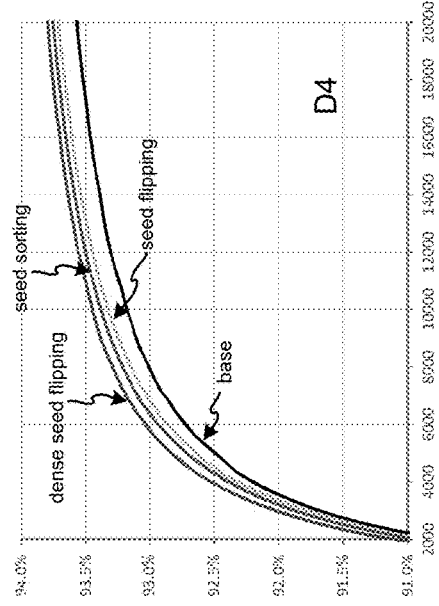
FIG. 10D illustrates the test coverage simulation result for successively applied test patterns for the circuit D4.
Figure 10A:
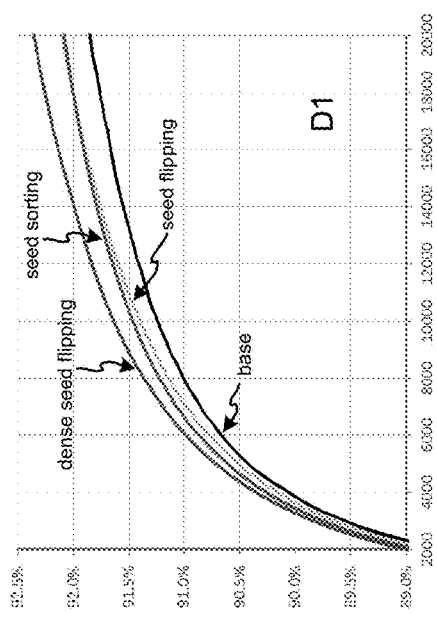
FIG. 10A illustrates the test coverage simulation result for successively applied test patterns for the circuit D1.
Figure 10C:
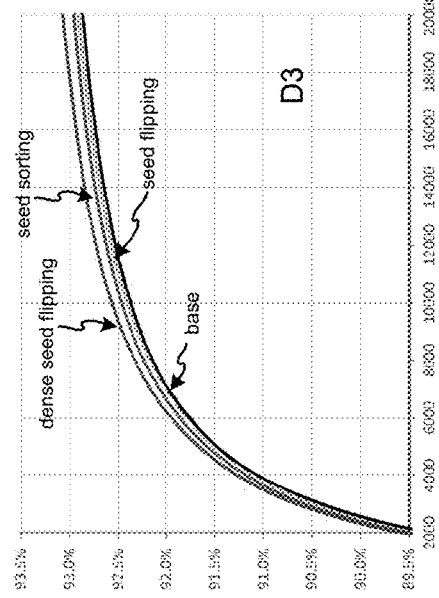
FIG. 10C illustrates the test coverage simulation result for successively applied test patterns for the circuit D3.
Figure 10E:
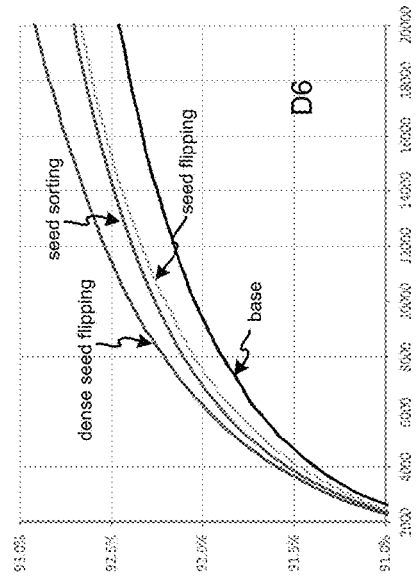
FIG. 10E illustrates the test coverage simulation result for successively applied test patterns for the circuit D5.
Figure 10F:
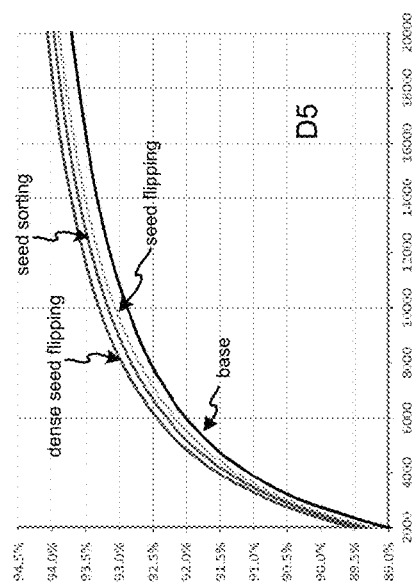
FIG. 10F illustrates the test coverage simulation result for successively applied test patterns for the circuit D6.
Figure 10G:
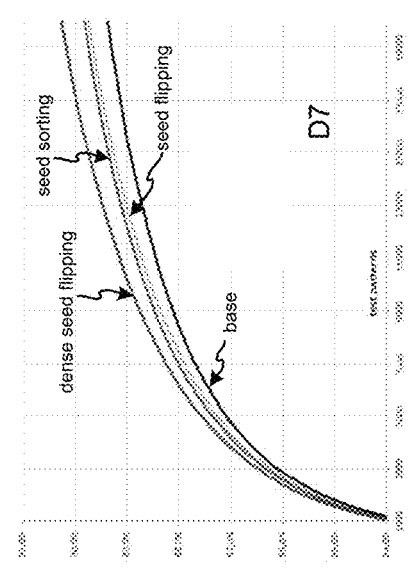
FIG. 10G illustrates the test coverage simulation result for successively applied test patterns for the circuit D7.
Figure 10H:
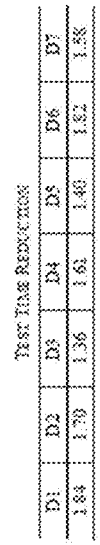
FIG. 10H illustrates results showing how quickly the dense seed flipping reaches test coverage that the baseline scheme yields after applying all 20K test patterns.

Moreover, the dense seed flipping leads to a performance superior over all of the other test schemes. Note that the dense seed flipping is the only one that breaks the barrier of 90% test coverage for design D7. FIG. 10H illustrates results showing how quickly the dense seed flipping reaches test coverage τ that the baseline scheme yields after applying all 20K test patterns. The results are derived by computing a ratio of 20K to the number of test patterns that the dense seed flipping needs to get to τ. For designs D1 and D6, the test time reduction is almost two-fold.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
   a bit-flipping signal generation device comprising a storage device and configured to generate a bit-flipping signal based on bit-flipping location information, the storage device configured to store the bit-flipping location information for a first predetermined number of groups of test patterns, the bit-flipping location information obtained through a fault simulation process;
   a pseudo random test pattern generator configured to generate test patterns based on the bit-flipping signal, the pseudo random test pattern generator comprising a register configured to be a linear finite state machine, the register comprising storage elements and bit-flipping devices, an output for each of the bit-flipping devices coupled to an input for one of the storage elements; and
   scan chains configured to receive the test patterns,
   wherein the bit-flipping signal causes one of the bit-flipping devices to invert a bit of the register each time after a second predetermined number of test patterns is being generated by the pseudo random test pattern generator during a test, a total number of test patterns generated during the test being equal to a product of the first predetermined number and the second predetermined number or the product plus the first predetermined number.

2. The circuit recited in claim 1, wherein the register is a ring generator and the pseudo random test pattern generator further comprises a phase shifter configured to drive the scan chains based on signals outputted by the register.

3. The circuit recited in claim 1, wherein the bit-flipping signal generation device further comprises a demultiplexer and a group counter, select inputs of the demultiplexer being coupled to outputs of the storage device, and the group counter being configured to select the bit-flipping location information for a particular group of test patterns in the first predetermined number of groups of test patterns stored in the storage device for the outputs of the storage device.

4. The circuit recited in claim 1, wherein capacity of the storage device is $glg_2k$ bits, k being equal to a number of the bit-flipping devices, g being the first predetermined number.

5. The circuit recited in claim 1, wherein the bit-flipping devices are XOR gates and the storage elements are flip-flops.

6. The circuit recited in claim 1, wherein the bit-flipping location information for two or more groups of test patterns in the first predetermined number of groups of test patterns is the same.

7. The circuit recited in claim 1, wherein the fault simulation process comprises:
performing fault simulation for groups of test patterns, a number of the groups of test patterns being equal to a number of the bit-flipping devices, each group in the groups of test patterns having the second predetermined number of test patterns and being generated by the pseudo random test pattern generator starting from a state obtained by activating one of the bit-flipping devices;
selecting a group of test patterns from the groups of test patterns which can detect a largest number of faults in a target group of faults based on the fault simulation;
saving location information associated with the group of test patterns and a state of the register associated with a last test pattern in the group of test patterns; and
updating the target group of faults by removing faults detectable by the group of test patterns.

8. The circuit recited in claim 7, wherein the fault simulation process further comprises:
repeating the operations in claim 7 until the target group of faults have no faults left or until a total number of groups of test patterns selected is equal to the first predetermined number.

9. One or more non-transitory computer-readable media storing computer-executable instructions for causing a computer to perform a method, the method comprising:
creating a circuit in a circuit design for testing a chip fabricated according to the circuit design, the circuit comprising:
a bit-flipping signal generation device comprising a storage device and configured to generate a bit-flipping signal based on bit-flipping location information, the storage device configured to store the bit-flipping location information for a first predetermined number of groups of test patterns, the bit-flipping location information obtained through a fault simulation process;
a pseudo random test pattern generator configured to generate test patterns based on the bit-flipping signal, the pseudo random test pattern generator comprising a register configured to be a linear finite state machine, the register comprising storage elements and bit-flipping devices, an output for each of the bit-flipping devices coupled to an input for one of the storage elements; and
scan chains configured to receive the test patterns,
wherein the bit-flipping signal causes one of the bit-flipping devices to invert a bit of the register each time a second predetermined number of test patterns is being generated by the pseudo random test pattern generator during a test, a total number of test patterns generated during the test being equal to a product of the first predetermined number and the second predetermined number or the product plus the first predetermined number.

10. The one or more non-transitory computer-readable media recited in claim 9, wherein the register is a ring generator and the pseudo random test pattern generator further comprises a phase shifter configured to drive the scan chains based on signals outputted by the register.

11. The one or more non-transitory computer-readable media recited in claim 9, wherein the bit-flipping signal generation device further comprises a demultiplexer and a group counter, select inputs of the demultiplexer being coupled to outputs of the storage device, and the group counter being configured to select the bit-flipping location information for a particular group of test patterns in the first predetermined number of groups of test patterns stored in the storage device for the outputs of the storage device.

12. The one or more non-transitory computer-readable media recited in claim 9, wherein capacity of the storage device is $glg_2k$ bits, k being equal to a number of the bit-flipping devices, g being the first predetermined number.

13. The one or more non-transitory computer-readable media recited in claim 9, wherein the bit-flipping devices are XOR gates and the storage elements are flip-flops.

14. The one or more non-transitory computer-readable media recited in claim 9, wherein the bit-flipping location information for two or more groups of test patterns in the first predetermined number of groups of test patterns is the same.

15. The one or more non-transitory computer-readable media recited in claim 9, wherein the fault simulation process comprises:
performing fault simulation for groups of test patterns, a number of the groups of test patterns being equal to a number of the bit-flipping devices, each group in the groups of test patterns having the second predetermined number of test patterns and being generated by the pseudo random test pattern generator starting from a state obtained by activating one of the bit-flipping devices;
selecting a group of test patterns from the groups of test patterns which can detect a largest number of faults in a target group of faults based on the fault simulation;
saving location information associated with the group of test patterns and a state of the register associated with a last test pattern in the group of test patterns; and
updating the target group of faults by removing faults detectable by the group of test patterns.

16. The one or more non-transitory computer-readable media recited in claim 15, wherein the fault simulation process further comprises:
repeating the operations in claim 15 until the target group of faults have no faults left or until a total number of groups of test patterns selected is equal to the first predetermined number.

* * * * *